United States Patent

Aguero et al.

[11] Patent Number: 5,807,613
[45] Date of Patent: Sep. 15, 1998

[54] METHOD OF PRODUCING REACTIVE ELEMENT MODIFIED-ALUMINIDE DIFFUSION COATINGS

[75] Inventors: Alina C. Aguero, Madrid, Spain; Maria N. Korotkin, Downsview, Canada

[73] Assignee: Cametoid Advanced Technologies, Inc., Whitby, Canada

[21] Appl. No.: 742,844

[22] Filed: Nov. 1, 1996

Related U.S. Application Data

[63] Continuation-in-part of Ser. No. 338,140, Nov. 9, 1994, abandoned.

[51] Int. Cl.$^6$ .................................................. B05D 3/02
[52] U.S. Cl. ........................ 427/528; 427/527; 427/531; 427/250; 427/376.8; 204/192.16; 148/633; 148/674; 148/675
[58] Field of Search .................................. 427/527, 528, 427/531, 566, 567, 578, 576, 563, 564, 593, 597, 250, 376.8; 204/192.15, 1.16; 148/633, 674, 675

[56] References Cited

U.S. PATENT DOCUMENTS

| | | | |
|---|---|---|---|
| Re. 31,339 | 8/1983 | Dardi et al. ............... | 427/250 |
| 3,754,902 | 8/1973 | Boone et al. . | |
| 3,874,901 | 4/1975 | Rairden, III ............... | 427/250 |
| 3,900,636 | 8/1975 | Curry et al. ............... | 427/531 |
| 3,998,603 | 12/1976 | Rairden, III ............... | 427/250 |
| 4,005,989 | 2/1977 | Preston . | |
| 4,024,294 | 5/1977 | Rairden, III ............... | 427/250 |
| 4,034,142 | 7/1977 | Hecht ........................ | 427/250 |
| 4,071,638 | 1/1978 | Chang et al. ............... | 427/250 |
| 4,198,442 | 4/1980 | Gupta et al. ............... | 427/376.8 |
| 4,307,132 | 12/1981 | Chu et al. . | |
| 4,406,252 | 9/1983 | Jones . | |
| 4,439,470 | 3/1984 | Sievers ....................... | 427/250 |
| 4,526,814 | 7/1985 | Shankar et al. .............. | 427/252 |
| 4,634,600 | 1/1987 | Shimizu et al. ............. | 427/531 |
| 4,714,624 | 12/1987 | Naik . | |
| 4,828,870 | 5/1989 | Ando et al. . | |
| 4,897,315 | 1/1990 | Gupta . | |
| 4,910,092 | 3/1990 | Olson et al. . | |
| 4,935,193 | 6/1990 | Grunke et al. .............. | 427/250 |
| 4,944,858 | 7/1990 | Murphy et al. . | |
| 4,963,237 | 10/1990 | Olds et al. .................. | 427/528 |
| 4,968,529 | 11/1990 | Hamamura et al. ........ | 427/131 |
| 4,973,393 | 11/1990 | Mino et al. ................. | 427/250 |
| 5,000,782 | 3/1991 | Olson et al. . | |
| 5,139,824 | 8/1992 | Liburdi et al. . | |
| 5,266,117 | 11/1993 | Beisswenger et al. . | |

FOREIGN PATENT DOCUMENTS

| | | | |
|---|---|---|---|
| 579199 | 11/1988 | Australia . | |
| 166349 | 1/1986 | European Pat. Off. ............... | 427/528 |

(List continued on next page.)

OTHER PUBLICATIONS

Teer et al, "Al–Zn Coutings for the Corrosion Protection of Steel", *Thin Solid Films*, 72, (1980) pp. 29–296, no month.

(List continued on next page.)

*Primary Examiner*—Marianne Padgett
*Attorney, Agent, or Firm*—Dowell & Dowell, P.C.; Lynn C. Schumacher; Hill & Schumacher

[57] ABSTRACT

There is disclosed a process for forming aluminide diffusion coatings containing reactive elements on metal substrates such as iron, nickel or cobalt based alloys for protection against high temperature oxidation or corrosive environments. The process includes depositing a mixed metal coating containing aluminum and at least one reactive element onto the metal substrate and heat treating the coated substrate to induce interdiffusion of elements between the substrate and the deposited metal coating. In one aspect of the invention, the reactive element is yttrium and the metal coating is deposited by ion plating yttrium-aluminum by thermal evaporation from a yttrium-aluminum source. The coated substrate is heat treated between 500°–1200° C. to form a reactive element modified-aluminide diffusion coating having a thin outer $Al_2O_3$ coating formed thereon.

21 Claims, 4 Drawing Sheets

FOREIGN PATENT DOCUMENTS

| | | | |
|---|---|---|---|
| 2226484 | 11/1974 | France . | |
| 105259 | 6/1985 | Japan . | |
| 40-4028869 | 1/1992 | Japan | 427/528 |
| 40-4254576 | 9/1992 | Japan | 427/528 |
| 405320874 | 12/1993 | Japan | 427/528 |
| 2252567 | 12/1992 | United Kingdom . | |

OTHER PUBLICATIONS

Hot Corrosion Of Yttrium–Modified Coatings Wang Fuhui et al. Materials Science and Engineering. A121 (1989) pp. 387–389, (no month).

And Reactive Element Modified Aluminide Diffusion Coatings On Superalloys: Environmental Testing Robert Blano et al. J. Electrochem. Soc., vol. 140. No. 4, Apr. 1993, pp. 119–1203.

The Formulation Of Aluminide Diffusion Coatings On Nickel Based materials By Hot Isostatic Pressing J.R. Blackford et al. Department of Engineering Materials, University of Sheffield. UK; H.I.P. Limited, Chestersfield, UK No Source of publication, no date, no page #, total pages 8.

... Coating on Super alloys: Codeposition Of Cr And Reactive Elements Robert Biano and Robert A. Rapp *J. Electochem Soc.*, vol. 140, No. 4, Apr. 1993, pp.1181–1190.

A Study Of Yttrium–Modified Aluminide Coatings On In 738 Alloy David C. Tu et al. J. Val. Sci. Techno., A 4(6), Nov./Dec. 1986, pp. 2601–2607.

A Study On Composite Coatings Of Yttrium Ion–Plating And Pack Aluminizing For High–Temperature Applications Kyoo Young Kim et al. Department of Materials Science and Engineering, Pohang University of Science and Technology and Research.

Institute of Industrial Science and Technology, 1193 (no month) Plenum Plublishers Corp. pp. 321–335 *Oxidation of Metals*, vol. 40, # 3/4.

Oxidation Resistance Of Aluminum–Coated FE–20Cr Alloys Containing Rare Earths Or Yttrium David R. Sigler GM NAO Research and Development Center, Metallurgy Department pp. 295–319 (320) *Oxidation of Metals*, vol. 40, Nos. 3/4, 1993 (no month).

FIG. 5

METHOD OF PRODUCING REACTIVE ELEMENT MODIFIED-ALUMINIDE DIFFUSION COATINGS

This application is a continuation-in-part application of U.S. patent application Ser. No. 08/338,140 filed on Nov. 9, 1994 entitled Method of Producing Reactive Element Modified-Aluminide Coatings, which application is now abandoned.

FIELD OF THE INVENTION

The present invention relates to a method of producing modified-aluminide diffusion coatings on metal substrates.

BACKGROUND OF THE INVENTION

In many industries the need for protective coatings for metal parts is crucial to maintain the mechanical integrity of the part due to constant exposure of the metal to high temperatures, thermal cycling, hot corrosive and/or oxidizing environments. The aerospace industry is one example where accelerated aging in engine components occurs due to engine parts being cycled between temperatures in excess of 1000° C. during operation and ambient temperature when not in use. The high temperatures and corrosive environment characteristic of operating gas turbines results in rapid corrosion and/or oxidation rates of unprotected metal parts and ultimately failure of the component and the turbine. Similarly, metallic materials used in moderate to high temperature corrosive environments such as coal gasification systems, furnace fixtures, heating elements, heat exchangers, components for automotive and fossil energy applications as well as for nuclear reactors, chemical processing equipment and molten carbonate fuel cells are prone to rapid degradation and failure if unprotected.

Two methods of forming protective coatings on metal components for these types of applications are well known. In the first method a mixed metal overlay coating is deposited onto a metal substrate. The mixed metal deposited on the substrate is from the family of coatings generally referred to as MCrAlY overlay coatings, where M comprises cobalt, iron or nickel (or mixtures thereof), Al is aluminum, Cr is chromium and Y is yttrium. These coatings are applied to the metal substrate and act as protective coatings in and of themselves as no significant diffusion coating per se is formed between the substrate and MCrAlY overlay coat. Interdiffusion is avoided if possible because aluminum diffusion into the substrate may be detrimental as it can lead to spalling of the overlay coating.

Methods currently used to deposit MCrAlY overlay coatings include electron beam vapor deposition, plasma spraying and other physical vapor deposition techniques. These are line of sight techniques so that components with complex geometries can be only partially coated or otherwise require a complex set-up for rotation of the component during coating, For example, U.S. Pat. No. 4,910,092 issued to Olsen discloses deposition of MCrAlY coatings by plasma spraying. The MCrAlY coatings themselves are very expensive as are most of the deposition techniques.

The second method of forming a protective coating on a metal substrate involves alteration of the substrate outer layer by interaction with selected elements resulting in the formation of so-called diffusion coatings. The most widely used diffusion coatings are aluminides, which include several intermetallic phases comprising aluminum and other elements from the substrate. This family of coatings can be applied by two groups of methods. The first group includes a process during which the deposition and diffusion steps occur concurrently and include pack cementation, high temperature chemical vapour deposition (CVD) and hot dipping. The second group of methods for growing the diffusion coatings comprise two stages; an initial deposition of an aluminum coating by slurry-fusion, low temperature CVD, ion vapour deposition (IVD), evaporation, electrodeposition or electrophoresis and a subsequent heat treatment to induce diffusion.

Of all the above-mentioned methods of producing diffusion coatings, only pack cementation, high temperature CVD and hot dipping are employed for industrial scale production. In the pack cementation process, the part to be treated is packed in a bed containing a source of aluminum and an activator, and then heated to between 700°–1100° C. for several hours, whereby aluminum is transported to the metal substrate and diffuses into the surface thereof.

A disadvantage of the aluminide diffusion coatings is that the mechanical properties, thickness and uniformity of the coating are a strong function of the chemical reactions and/or solid solution formation occurring between the elements of the substrate and aluminum coating, which can vary significantly depending on the metal or metal alloy comprising the substrate. Aluminide diffusion coatings are also prone to fracturing or cracking in the thickness range generally considered optimum for oxidation/corrosion resistance due to brittleness of the coating. Because the aluminide diffusion coating is an integral part of the substrate surface, these flaws will generally propagate from the diffusion coating into the bulk of the substrate thereby resulting in failure. Thinner aluminide diffusion coatings may exhibit increased ductility and hence increased fracture resistance, but this is at the expense of reduced oxidation resistance of the coatings. These types of problems are not as significant with MCrAlY coatings because interdiffusion between the overlay coating with the substrate material is a second order effect which does not generally impact on the protective function of the overlay coat.

Platinum-aluminide diffusion coatings are currently available as disclosed in United Kingdom Patent No. 1,210,026 and U.S. Pat. No. 4,501,776. This type of coating is produced by a process involving first electroplating platinum onto the metal substrate, followed by heat treatment to induce interdiffusion, followed by a pack cementation process or high temperature CVD to produce the corresponding aluminide. A significant improvement in the performance of diffusion aluminides was observed when platinum was incorporated into the aluminide coating. However, as much as 10 μm of platinum must be electroplated so that the coatings produced in this way are quite expensive. In addition, the waste solutions resulting from the electroplating step represents a significant environmental hazard.

Chemical vapour deposition (CVD) has also been used for producing enhanced aluminide diffusion coatings on more complex geometries using forced flow of metal species. The protective properties of aluminide diffusion coatings can be enhanced by addition of, for example, platinum or yttrium, and such metal species are present initially in the form of gaseous organometallic precursors which chemically decompose to the elemental metal. U.S. Pat. No. 5,292,594 discloses the use of CVD to deposit such metals from their organometallic precursors followed by deposition of an aluminum coating and then heat treatment.

As mentioned above, a key component in both MCrAlY overlay coats or some modified aluminide coatings is the presence of a reactive element. The most common reactive elements for the modified aluminide diffusion coatings are yttrium (Y), cerium (Ce) and hafnium (Hf), with yttrium also being used in the MCrAlY overlay coatings. U.S. Pat. Nos. 4,835,011, 5,000,782 and 4,910,092 issued to Olsen et al. disclose aluminizing MCrAlY coatings containing silicon to form protective aluminide coatings.

U.S. Pat. No. 4,944,858 issued to Murphy et al. is directed to producing aluminide diffusion coatings by simultaneously sputter depositing aluminum and yttrium onto a superalloy substrate heated to within the range of 1010° C. to 1150° C. followed by high temperature annealing. A drawback of this method is the necessity for the high substrate temperatures during sputter deposition to ensure the formation of the diffusion coating.

The presence of the reactive elements is essential to providing enhanced aluminum oxide scale adherence under cyclic oxidation conditions and while the mechanism of enhancement is not fully understood, it is believed to be due to a combination of several factors including mitigation of transient oxidation; better adhesion of thin protective top layer of alumina; improved scale plasticity; and modification of scale structure and morphology.

As discussed above, these reactive elements may be incorporated into aluminide coatings using CVD wherein the reactive metal is introduced as an organometallic precursor.

In view of the expense of producing MCrAlY overlay coatings and the limitations associated with depositing coatings onto substrates having complex geometries, there is a real need for a simple, economical method of producing aluminide diffusion coatings on metal substrates containing a reactive element which avoids the limitations found in known aluminide diffusion coatings.

SUMMARY OF THE INVENTION

It is an object of the present invention to provide a method of producing reactive element modified-aluminide diffusion coatings on metal substrates which is simpler and more economical as compared to prior art methods and provides equivalent or superior oxidation/corrosion protection, and improved uniformity of distribution of reactive elements in the coatings.

It is also an object of the present invention to provide a method of producing reactive element modified-aluminide diffusion coatings on metal substrates which exhibit oxidation and/or corrosion resistance at elevated temperatures superior to aluminide diffusion coatings produced using prior art methods.

The present invention provides for the first time a viable commercial, large scale method for producing reproducible and cost-effective coatings over a 6 ft×12 ft surface area. A major problem with known coating methods for producing coatings incorporating reactive metals such as yttrium is the reactivity of the reactive element makes it too difficult to handle. It simply oxidizes too fast. Attempts to overcome this problem with deposition processing using, for example, pack cementation have not provided reproducible coatings which thereby prevents commercial exploitation. The present method surprising overcomes these problems and is commercially applicable for coating of large surface areas. The process leaves no powders or other chemicals to dispose of and the coatings cost considerably less than for example platinum aluminides.

The present method is also very advantageous over known methods because it requires the deposition of only one coating whereas many known processes involve sequential deposition of two or more layers with a heat treatment step after each layer is deposited.

In accordance with these objects, the present invention provides a method of producing a modified-aluminide diffusion coating on a metal object formed of a metal selected from the group consisting of steels, stainless steels, iron based superalloys, nickel based superalloys and cobalt based superalloys. The method comprises providing the metal object and fixing the metal object within a coating apparatus. The method includes providing a source having a substantially uniform mixture of aluminum and at least one element selected from the group consisting of yttrium, scandium, cerium, lanthanum, hafnium, silicon, zirconium, thorium and samarium with the at least one element is present in the range of from about 0.01% to about 20% by weight. The method comprises depositing a metal coating on the metal object by physical vapor deposition from the source. The coated object is then heat treated in an inert gas or a reducing gas atmosphere within an effective temperature range and for an effective period of time to cause interdiffusion between the metal object and the metal coating to form the modified-aluminide diffusion coating.

In another aspect of the invention there is provided a method of producing a modified-aluminide diffusion coating on a metal object formed of a metal selected from the group consisting of steels, stainless steels, nickel alloys, iron based superalloys, nickel based superalloys and cobalt based superalloys. The method comprises providing the metal object and fixing the metal object within a coating apparatus and providing a source having a substantially uniform mixture of aluminum and at least one element selected from the group consisting of yttrium, scandium, cerium, lanthanum, hafnium, silicon, zirconium, thorium and samarium. The at least one element being present in the range of from about 0.01% to about 20% by weight. The process comprises thermally evaporating material from the source and depositing a metal coating on the metal object by ion vapor deposition. The coated metal object is then heat treated in an inert gas or reductive gas atmosphere within an effective temperature range and for an effective period of time to promote interdiffusion between the metal object and said metal coating to form the modified-aluminide diffusion coating.

In another aspect of the invention there is provided a method of producing a modified-aluminide diffusion coating on a metal object formed of a metal selected from the group consisting of steels, stainless steels, nickel alloys, iron based superalloys, nickel based superalloys and cobalt based superalloys. The method comprises providing the metal object and fixing the metal object within a coating apparatus and providing a source consisting essentially of a uniform mixture of aluminum and yttrium, yttrium being present in the range of from about 0.01% to about 20% by weight. The method comprises thermally evaporating material from the source and depositing a metal coating on the metal object by ion vapor deposition. The coated metal object is then heat treated in an inert gas or reductive gas atmosphere at a temperature in the range from about 500° C. to about 1200° C. for a period of time between about 1 hour to about 24 hours to promote interdiffusion between the metal object and the metal coating to form the modified-aluminide diffusion coating.

BRIEF DESCRIPTION OF THE DRAWINGS

The method of producing modified-aluminide diffusion coatings on metal substrates according to the present invention will now be described, by way of example only, with reference being made to the accompanying drawings, in which.

DETAILED DESCRIPTION OF THE INVENTION

The present invention relates to the industrial scale production of modified-aluminide diffusion coatings by physical vapour deposition of a metal coating comprising aluminum and another element. Aluminum and the other element are concurrently or simultaneously deposited so that the metal coating is a mixed metal coating referred to as a "modified-aluminum coating". The coated substrate is then heat treated to produce a "modified-aluminide diffusion coating". As will be more fully described hereinafter, in the term "modified-aluminide diffusion coating" as used herein "modified" refers to modification of standard aluminide coatings to include an element, the presence of which ultimately results in an enhancement, over straight aluminide diffusion coatings, of the protective qualities of the aluminide coating under corrosive and/or oxidative environments. The substrates on which the modified aluminide diffusion coatings are deposited include all metal or alloys on which diffusion coatings can be formed. Such substrates include but are not limited to iron, nickel and cobalt based alloys.

As used herein, the phrase "reactive element modified-aluminum metal coating" means a metal coating comprising aluminum and at least one suitable reactive element and possibly more. As used herein the phrase "reactive element modified-aluminide diffusion coating" refers to an aluminide diffusion coating which is formed when the reactive element modified-aluminum metal coating is heat treated to sufficiently a high temperature to induce interdiffusion between the metal coating and the substrate. It is to be understood that the diffusion coating produced in this way will contain the reactive element, aluminum and elements from the substrate. Reactive element modified-aluminide diffusion coatings formed in this way provide enhanced protection in corrosive and high temperature environments such as encountered in ground-and aero-based gas turbines, chemical and fossil energy industries, molten carbonate fuel cells and the like.

The method of producing the reactive element modified-aluminide diffusion coatings comprising the subject invention is a two step tandem process, involving first the deposition of a reactive element modified-aluminum metal coating onto a substrate, followed by a heat treatment step within an effective temperature range and for an effective period of time to induce interdiffusion. The deposition process involves the deposition of a reactive element modified-aluminum coating from a single source comprising the reactive elements and aluminum. Thus, the first step comprises the codeposition of aluminum and at least one reactive element. As used herein the term "reactive element" is meant to cover those reactive elements known to those skilled in the art comprising yttrium, scandium, hafnium, cerium, lanthanum, silicon, zirconium, rhenium, samarium and thorium.

The reactive element modified-aluminum metal coating is deposited in an inert gas environment. The metal coating is deposited from a single source with the reactive element concentration in the reactive element-aluminum metal source chosen so that the deposited metal coating contains the reactive element in the range of from about 0.01 to about 20% by weight, with the balance being aluminum. A more preferred range is from about 1 to about 10% by weight of reactive element, with the balance being aluminum. Yttrium is the most preferred reactive element when a single reactive element is present in the reactive element-aluminum coating, while other preferred reactive element-aluminum combinations include hafnium-aluminum and silicon-aluminum.

The reactive element modified-aluminum metal coating deposited prior to heat treatment may contain more than one reactive element. For example, tertiary coatings may also be produced so long as the aluminum and reactive elements are uniformly distributed through the metal mixture when a single source is used. Preferred mixtures include yttrium-hafnium-aluminum, yttrium-silicon-aluminum and hafnium-silicon-aluminum. The total sum of the reactive elements is in the range from about 0.01 to about 20% by weight and preferably from about 1 to about 10% by weight.

If individual sources are used for each element, the deposition parameters for each element are chosen to ensure the resulting reactive element-aluminum coating contains the reactive element in the range from 0.01 to 20%. The source(s) may be wires, ingots, powders, targets and the like.

The preferred process for depositing the reactive element modified-aluminum metal coatings on the substrate includes the use of ion plating or ion vapour deposition (IVD). A review of the theory and operation of ion plating is found in Nadir A.G. Ahmed, *Ion Plating. Optimum Surface Performance And Material Conservation*, Thin Solid Films, 241, 179–187, (1994). This method of deposition will be known to those skilled in the art. Several advantages of ion plating are: 1) because the entire substrate is biased negatively, the positively charged metal species are attracted to the entire exposed surface so that irregularly shaped substrates can be provided with a relatively uniform coating; and 2) because the substrate is negatively biased, it is constantly bombarded by positively charged species which provides enhanced adhesion and control of the density of the deposited coatings.

Figure 1:
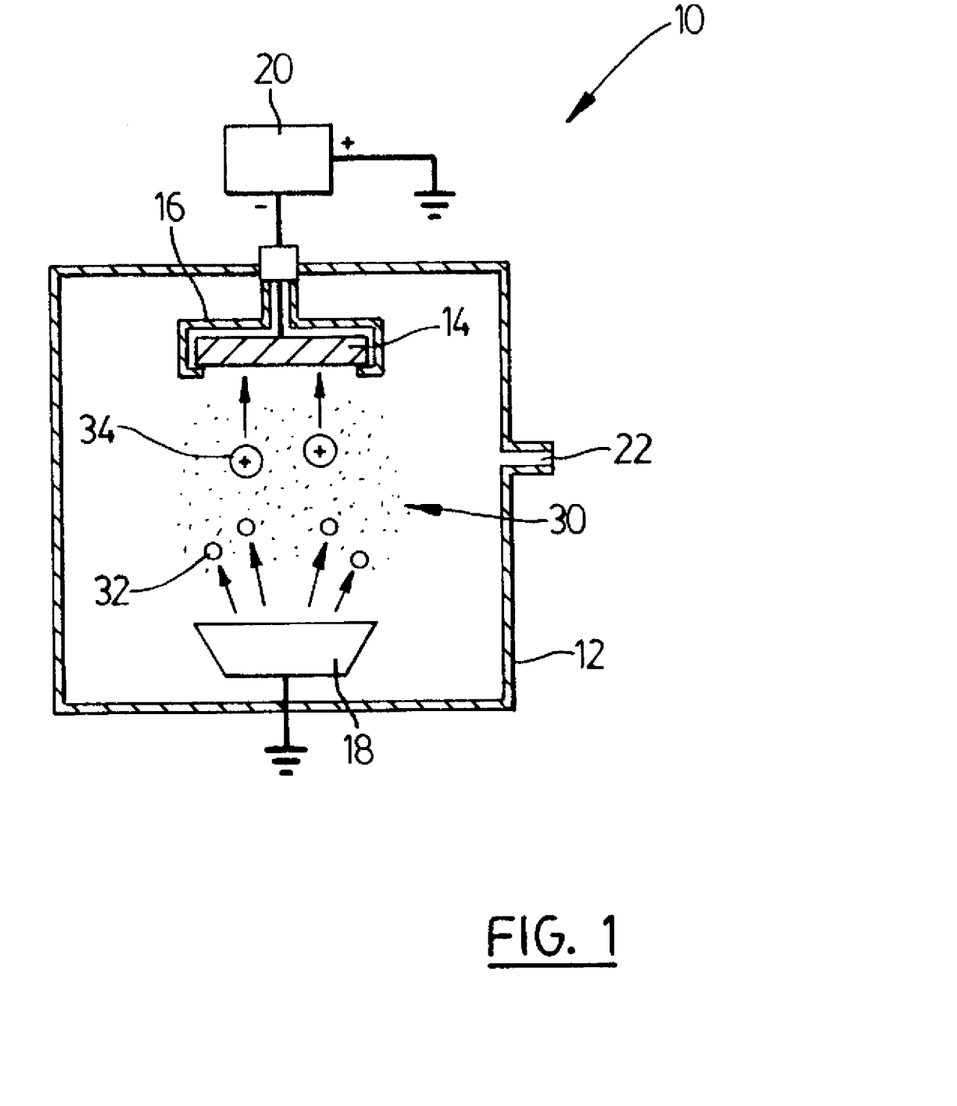
FIG. 1 is a diagrammatic representation of an ion plating process used in the method of the present invention for producing modified-aluminide diffusion coatings on metal substrates.

The basic ion plating system comprises a steel vacuum chamber, a pumping system, a parts holder or rack for fixturing the substrate in the vacuum chamber, a high voltage power supply which can be used to apply a negative potential to the parts holder or rack, and an evaporation source. Referring to FIG. 1, the ion plating technique is carried out in a plating system shown generally at 10 comprising a vacuum chamber 12 with the metal substrate or workpiece 14 to be coated fixtured to a rack 16 located above a resistively heated evaporation crucible 18 containing a reactive element modified-aluminum source (not shown). Substrate 14 is biased with a negative potential by an external power supply 20. A gas inlet 22 supplies vacuum chamber 12 with inert or reductive gas(es). There are several commercial plating systems available and a McDonnel Douglas Ivadizer™ was used to deposit the coating in the examples described hereinafter.

While evaporation of the metallic sources using resistively heated crucibles 18 was used in conjunction with ion plating employed to produce the coatings in the EXAMPLES 1 and 2 described below, it will be understood by those skilled in the art that there are other alternative techniques or devices which could be used to produce the metal vapors to be deposited on the substrate. Some examples are flash evaporators, electron beam guns, R.F. inductively heated sources, arc evaporators, ion beam evaporators and the like.

In operation, the metal substrate 14 on which the reactive element-aluminide diffusion coating is formed may be cleaned by sand blasting, followed by vapour degreasing in organic solvents such as trichloroethylene, isopropanol and other suitable solvents. The reverse of this cleaning process may also be used. Substrate 14 is then fixed in vacuum chamber 12 by being attached to the electrically conductive rack 16 so that electrical contact is made between the substrate and rack. Vacuum chamber 12 is pumped down to the desired pressure and the inert or reductive gas is admitted to the vacuum chamber. The reactive element modified-aluminum metal source material is thermally or resistively evaporated from crucibles 18 into an argon sustained plasma 30 formed between the grounded crucibles and the negatively biased rack 16. A fraction of the thermally evaporated neutral atomic constituents 32 of the source material is ionized and the resulting positively charged species 34 are accelerated toward metal substrate 14 and plated thereon. Typically the object being coated is not heated directly by a heater during deposition of the coating.

The use of ion vapour deposition is the preferred method of deposition in the present invention and has several advantages. The process of ion vapour deposition provides enhanced adhesion between the deposited coating and the substrate. This is due to the evaporated ions having increased kinetic energies so that upon collision with the substrate penetration occurs to produce a graded interface between the substrate and coating. Another advantage is the glow discharge continuously cleans the substrate before and after deposition. The IVD process does not adversely affect the mechanical properties of the substrate material because the substrate temperature does not exceed 100° C. during the deposition step. The coatings deposited by IVD are characterized by a fine columnar structure tolerant to thermal mechanical stresses up to 400°–500° C. Coatings formed by IVD have a high degree of uniformity of coating thickness and structure. These coatings may be applied with precise thickness control on a wide range of shapes and are non-toxic.

The process disclosed herein advantageously provides a method of producing corrosive and high temperature oxidation resistant coatings by depositing onto a substrate which does not require heating to high temperatures during deposition of the coating material onto the object. This is very advantageous because it avoids the significant problems of surface damage and various other types of crystal damage which occurs where high substrate temperatures are required during deposition of the coating material. The need to heat the substrates to high temperatures is a particularly accute problem from a commercial point of view when coating large surface area objects where large heaters are required and where nonuniform surface temperatures result in local areas with poor quality coatings.

Figure 4:
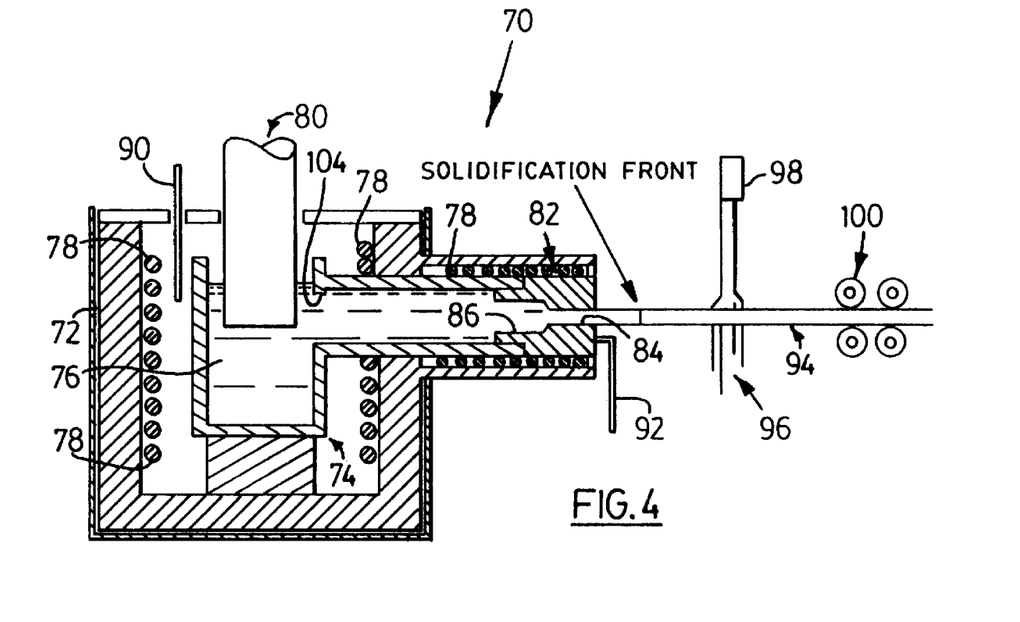
FIG. 4 is a cross sectional view of a horizontal Ohno continuous casting apparatus used for making source materials used for making the coatings of the present invention.

The sources used in the examples described hereinafter comprised wires produced using the Ohno continuous casting process. Details of this process are disclosed in A. Ohno, "Continuous Casting Of Single Crystal Ingots"; J. Metals, Vol. 38, 14 (1986), which is incorporated herein by reference. Referring to FIG. 4, an Ohno continuous casting (OCC) apparatus for producing source wires is shown generally at 70. Apparatus 70 comprises a melting furnace 72 enclosing a crucible 74 heated to a temperature just above the liquidus of the alloy 76 being cast using heater wires 78 coiled about the furnace. A cylindrical hollow displacer block 80 made of alumina is provided for molten metal level control. Apparatus 70 includes a graphite mold 82 which is 105 mm in length and 20 mm outer diameter having a cylindrical channel 84 which is 2 mm in diameter and 13 mm in length which determines the maximum diameter of the cast wires. The remainder of the mold cavity 86 was 10 mm in diameter in order to assist molten metal flow and heater wires 78 also heat the mold. A furnace thermocouple 90 is provided along with a control thermocouple 92 positioned about 7 mm into the exit side of mold 82. Cooling of the cast wire 94 was achieved using a free falling column of water 96 from a small tube 98 placed about 30 mm above the cast strand. Pinch rolls 100 are used for withdrawal of the cast wire.

The processing parameters were mold temperature, mold-cooler distance and casting speed. The mold temperature was preset throughout the casting operations at 680±2° C. above the melting temperature of aluminum. The cooling water flow rate was 220–240 ml/minute and the mold-cooler distance adjusted between 10–15 mm. To initiate casting a stainless steel tube 2 mm in diameter was positioned at the mold exit and a small dummy wire was inserted into it. When the temperature attained the set value at 680° C., the molten metal was fed into the mold 82 by lowering displacer block 80 into crucible 74 to raise the molten metal level about 20–30 mm above the metal intake 104 of the mold. The casting speeds were in the range between 0.07 and 1.7 m/minute. The melt stock was prepared by alloying 99.9% aluminum and Al-87% master alloy using a vacuum induction furnace.

Figure 5:
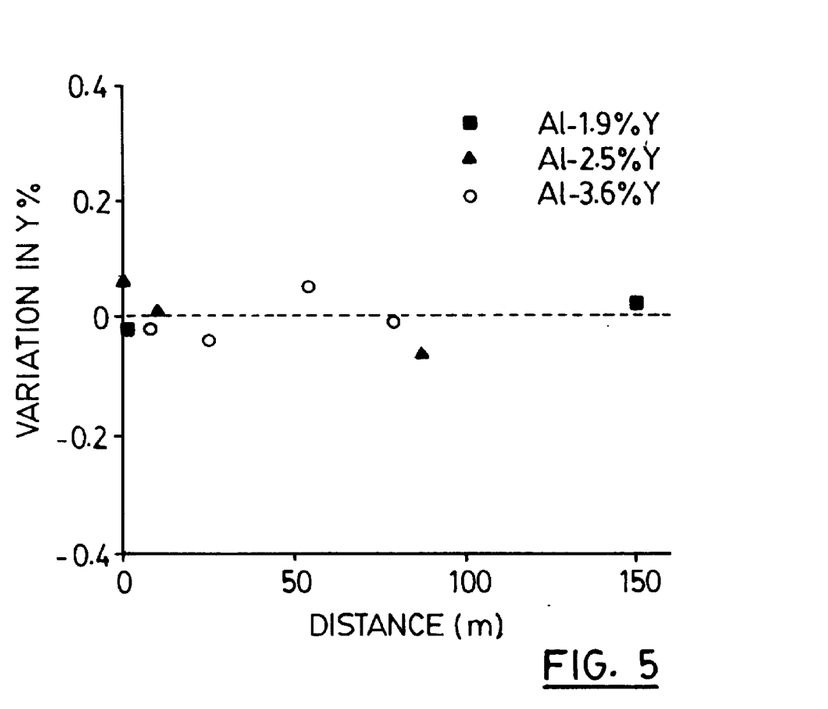
FIG. 5 is a plot showing the variation in yttrium concentration along the length of cast wires used as sources in the present method.

The sources must have a fairly uniform composition along their length and diameter. FIG. 5 illustrates the variation in yttrium concentration along the length of three different aluminum/yttrium wires differing in the amount of yttrium present which were used as source materials from which the present coatings were formed. It can be seen from this data that the yttrium is substantially uniformly distributed in the aluminum.

Other methods of production of the sources may include for example powder metallurgical techniques, casting or any other conventional wire manufacturing process, carried out under an inert or reductive gas atmosphere to avoid oxidation of the reactive element. A substantially uniform distribution of the reactive element(s) throughout the aluminum/ reactive element source material is required to ensure the resulting coatings exhibit increased corrosion and or oxidation resistance.

After the reactive element modified-aluminum coating has been deposited the coated substrate is heat-treated under an inert gas atmosphere to form a reactive element modified-aluminide diffusion coating containing aluminum, the corresponding reactive element(s) and other elements from the substrate with a thin protective top layer of $Al_2O_3$.

> Heat treatment of the coated samples is carried out under an inert or reductive atmospheric, vacuum or sub-atmospheric pressures in the presence of either inert or reductive gases to avoid oxidation during interdiffusion and also to reduce losses of aluminum by evaporation. The heat treatment temperatures are selected to be effective to induce interdiffusion with the substrate and to form the protective intermetallic phases.

The deposition and heat treatment parameters are chosen to promote formation of about 50 $\mu$m to about 150 $\mu$m thick diffusion coating. The heat treatment comprises subjecting the coated substrates to one or more temperatures for prolonged periods of time, and usually within the temperature range of from about 500°–1200° C. for about 1–24 hours. The temperature and duration of the heat treatment used depends on the substrate composition and the end application for the substrate, Those skilled in the art will appreciate that because the formation of diffusion coatings is caused by interdiffusion between the deposited metal coating and the substrate, the present invention is directed to producing reactive element-aluminide coatings on those metals and alloys comprising elements which are capable of reacting to form suitable aluminides on which a coherent, protective $Al_2O_3$ scale can be formed, and provided that the selected metals or alloys are stable at the processing temperatures employed throughout the coating process.

The coatings produced by the method disclosed herein are also surprising resistant to both chemical corrosion, such as in molten carbonate fuel cell environments, as well as being resistant to high temperature oxidation environments such as found in jet engine turbines. To date, no economical coating process is known which can produce coatings exhibiting extended lifetimes in both types of rigorous environments, see the Examples herebelow.

The method of the present invention has been described with particular emphasis on the aforementioned reactive elements. The inventors contemplate that the present method is also applicable for producing modified-aluminide coatings when other elements are incorporated that increase the oxidation and/or corrosion resistance of the aluminide coatings, even though such elements are not recognized as falling in the category of "reactive elements". Such elements include ruthenium, rhodium, iridium, osmium, palladium, niobium and platinum. As mentioned above, the platinum-aluminide coatings that have been produced using electrodeposition provide good protection but are expensive to produce. As discussed above, aluminide coatings incorporating reactive elements, or those different elements which advantageously modify aluminide coatings, are more generally referred to as "modified-aluminide coatings", of which "reactive element modified-aluminide coatings" are a subset.

While evaporation of the metals combined with ion plating deposition has been disclosed herein as being the preferred process for depositing the reactive element modified-aluminum coatings, it will be appreciated by those skilled in the art that other combinations could be used to deposit the coatings. For example, where line of sight deposition is sufficient, ion plating need not be used and other physical vapour deposition methods may be used including electron beam evaporation, atomic sputtering and plasma spraying to mention a few. It is to be noted, however, that in those applications where it is desirable to coat most of the substrate, ion plating is preferred because it is not inherently limited to line-of-sight deposition of the metal coating.

Figure 2:
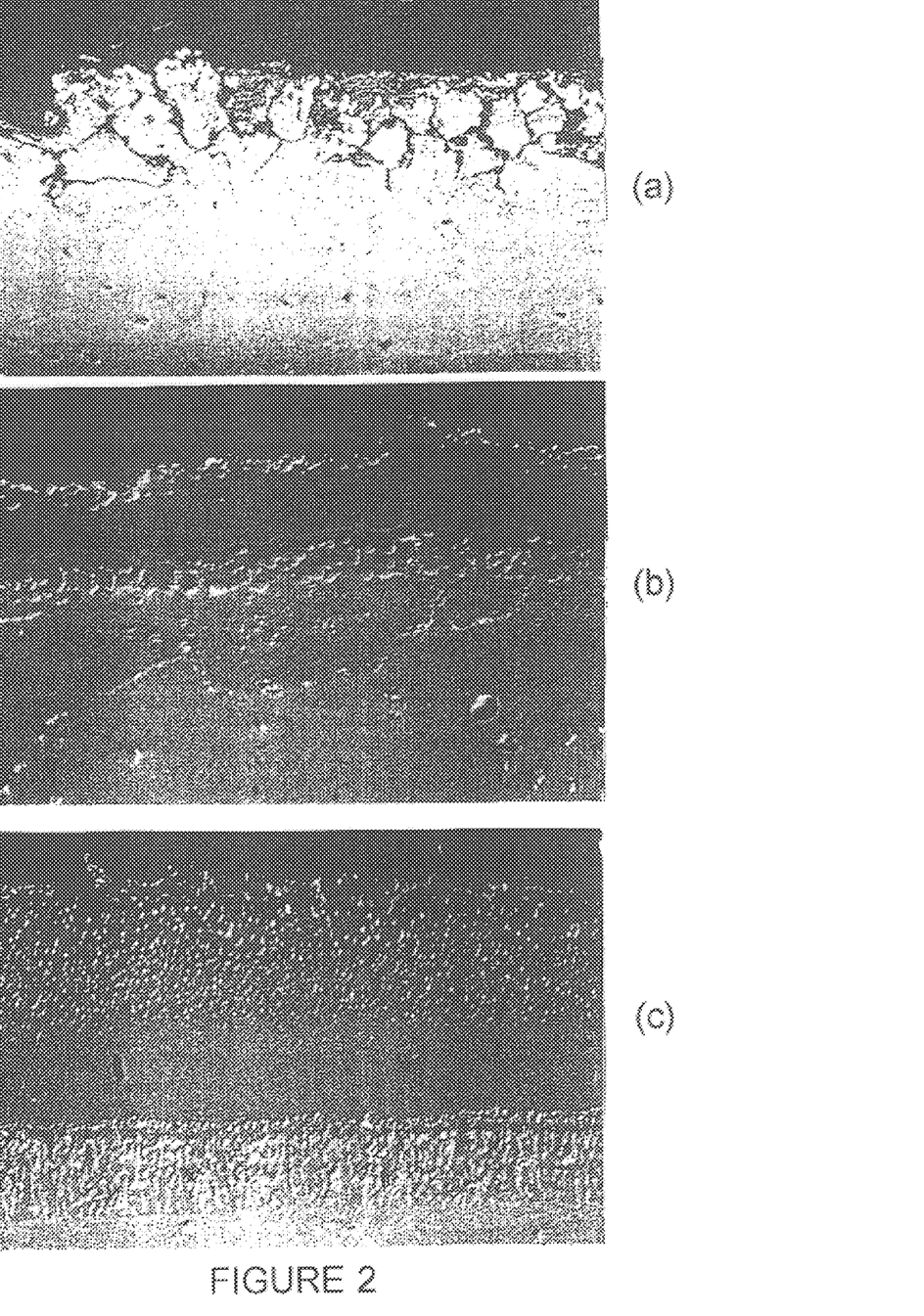
FIG. 2 shows cross sectional optical micrographs of samples after 200 hours of cyclic oxidation testing (50 minutes at 1050° C., followed by 10 minutes at room temperature per cycle) for, (a) an uncoated IN738 substrate; (b) an IN738 substrate having an aluminide coating formed thereon by depositing 25 to 28 µm aluminum by ion plating followed by heat treatment for 1 hour at 700° C. and 3 hours at 1080° C.; and (c) an IN738 substrate having a 1.5% yttrium-aluminide diffusion coating of the same initial thickness as in FIG. 2(b) deposited by ion plating on IN738 and followed by heat treatment for 1 hour at 700° C. and 3 hours at 1080° C. in accordance with the present invention.
Figure 3:
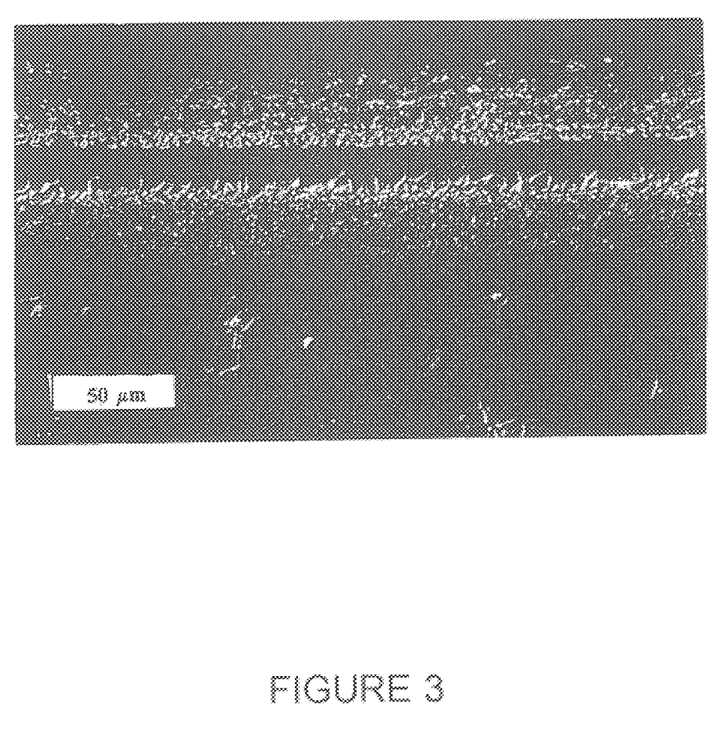
FIG. 3 shows a cross sectional optical micrograph of a 304 stainless steel sample coated with a yttrium-aluminide diffusion coating formed by depositing 20 µm of 1.5% yttrium-aluminum and heat treating for 5 hours at 850° C. according to the present invention, the micrograph was taken after 500 hours of immersion in a 62 mole% $Li_2CO_3$-38 mole% $K_2CO_3$ mixture at 650° C.

The following non-limiting examples and the optical micrograph photocopies of FIGS. 2 and 3 will further illustrate the present method and representative coating formed using the method disclosed herein.

EXAMPLE I

A yttrium-aluminum wire containing 1.5% by weight yttrium and having a diameter of 1.6 mm was produced using the Ohno method. The yttrium was uniformly distributed throughout the aluminum. The wire was fed to three resistively heated crucibles. IN738 coupons were employed as substrates. The yttrium-aluminum metal wire was thermally evaporated and deposited by ion plating onto the IN738 substrates to a thickness of about 25 to 35 $\mu$m. The wires were fed at a rate of 55 cm/min and a current of 550 amperes was applied to the crucibles to effect evaporation. After initial evacuation, the chamber was back-filled filled with argon and a 250 volt, 0.1 ampere bias was applied to the metal substrates being coated. The deposition time was 20 minutes and the pressure in the chamber during deposition was 1.866Pascal ($1.4\times10^{-2}$ torr). The coated substrates were then heat treated in argon for 1 hour at 700° C., followed by 3 hours at 1080° C. under argon at a pressure slightly higher than atmospheric pressure for both temperatures. The resulting substrate with the yttrium modified-aluminide diffusion coating was tested for resistance to cyclic oxidation, where each cycle corresponded to 10–15 minutes at room temperature and 45–50 minutes at 1050° C. The coated substrates were subjected to 800 cycles and showed no signs of substrate penetration.

FIG. 2 shows cross sectional optical micrographs of three different samples after 200 hours of cyclic oxidation testing (50 minutes at 1050° C., followed by 10 minutes at room temperature) for, (a) an uncoated IN738 substrate; (b) an aluminide coating (absent a reactive element) deposited on IN738 by ion plating followed by heat treatment for 1 hour and (c) the yttrium modified-aluminide diffusion coating of EXAMPLE I. Degradation of the uncoated substrate is clearly visible while the yttrium modified-aluminide coating of FIG. 2(c) does not show any significant degradation.

EXAMPLE II

Coupons of 304 stainless steel were coated with 20–22 $\mu$m of yttrium-aluminum following the same procedure as described in EXAMPLE I. The samples were heat treated under argon for 5 hours at 850° C. to produce a yttrium modified-aluminide coating. The corrosion kinetics were determined using electrochemical methods while immersed in a mixture of 62 mole % $Li_2CO_3$–38 mole % $K_2CO_3$ at 650° C. under an inert atmosphere. To measure the instantaneous corrosion rates, a potentiometer interconnected with working, counter and reference electrodes was employed with the working electrode being the coated coupon. Continuous current methods were used to determine the corrosion rate using interception and polarization resistance (PR) techniques. The weight loss as a function of time and the corrosion kinetics were determined using Faraday's law. From the kinetic results it was estimated that the total weight loss for a coated sample was approximately 0.1 mg/mm$^2$ after 20,000 hours, whereas an uncoated sample exhibited a weight loss of about 2.5 mg/mm$^2$.

Referring to the optical micrograph of FIG. 3 it is shown that there were no signs of degradation or penetration after 500 hours immersion in molten carbonate at 650° C.

As previously discussed, in view of the fact that the reactive element modified-aluminide diffusion coating is formed by interdiffusion between the deposited metal coating and the metal substrate, it will be appreciated that the present method may be used with metals or metal alloy substrates comprising elements which are capable of reacting to form suitable aluminide coatings, on which relatively uniform and contiguous aluminum oxide layers or scales can form. Suitable metal or metal alloy substrates include, for example, alloys typically used in the aerospace industry which are predominantly iron, nickel, and cobalt based superalloys.

EXAMPLE III

The IVD/yttrium aluminide diffusion coatings on steel SS310 withstood corrosion tests simulating the environment in molten carbonate fuel cells (MCFC) at 650° C. for 600 hours, Coated nickel alloy samples were also evaluated in thermal cycling tests for a total of 800 cycles (75 minutes/cycle) at 1050° C. in which the yttrium aluminide coatings survived with minor damage to the outer coating layers. Conventional aluminide coatings and uncoated nickel alloy samples were observed to undergo significant corrosion under the same testing conditions. The modified yttrium aluminide coatings formed using the present process did not appear to suffer deterioration after 400 hours of thermal cycle testing at 1100° C. For the hot corrosion test, the coated coupons were immersed in a $Na_2SO_4/MgSO_4$ (60%:40%) mixture and exposed to an atmosphere of air.$SO_2$ (2000 ml/min:5 ml/min) in a furnace at 900° C. The yttrium aluminide coatings withstood exposure to the sulphate environment with little or no significant damage observed after 540 hours. The results clearly show that the modified aluminide coatings formed using the present invention exhibit a strong enhancement in protective properties in both high temperature oxidizing and corrosive environments compared to conventionally produced yttrium aluminide coatings.

The method for producing reactive element modified-luminide diftsion coatings disdosed herein is highly advantageous in comparison to the known methods for producing the same general type of coatings. The present invention provides for the first time a straightforward and economical process for the industrial scale production of reactive element modified-aluminide coatings. The present process does not produce waste by-products as for example pack cementation or electroplating, and so it is not problematic with respect to the environment. Further, the coatings produced by the present method disclosed herein exhibit performance equivalent to or better than platinum-aluminide coatings, but at a much lower cost.

Examples of substrate materials on which the present modified diffusion coatings have been formed exhibiting enhanced corrosion and temperature resistance include steel 4130, stainless steels SS304, SS310, SS316, nickel superalloys including IN738, UDIMET 500, 501, 520, 720, Rene 80 and PWA 1480; and the cobalt alloy Stellite.

While the method of producing reactive element modified-aluminide diffusion coatings on metal substrates according to the present invention has been described and illustrated with respect to the preferred and alternative embodiments, those skilled in the art will appreciate that variations of this method may be made without departing from the scope of the invention disclosed herein.

Therefore what is claimed is:

1. A method of producing a modified-aluminide diffusion coating on a metal object formed of a metal selected from the group consisting of steels, nickel based alloys and cobalt based alloys, comprising:

providing the metal object and fixing the metal object within a coating apparatus;

providing a source comprising a uniform mixture of aluminum and at least one element selected from the group consisting of yttrium, scandium, cerium, lanthanum, hafnium, silicon, zirconium, thorium and samarium, said at least one element being present in a range of from about 0.01% to about 20% by weight;

depositing a single layer metal coating of preselected thickness from said source on said metal object by physical vapor deposition; and heat treating the coated metal object in an inert gas or a reducing gas atmosphere within an effective temperature range and for an effective period of time to cause interdiffusion between the metal object and the metal coating to form the modified-aluminide diffusion coating.

2. The method according to claim 1 wherein said source material is thermally evaporated, including forming a plasma within said coating apparatus and impressing a negative potential on said metal object effective to ion plate said metal coating onto the metal object.

3. The method according to claim 2 wherein the effective temperature range during heat treating is between about 500° C. to about 1200° C., the effective period of time being between about 1 hour to about 24 hours.

4. The method according to claim 3 wherein said at least one element is present in the range from about 1% to about 10% by weight.

5. The method according to claim 2 wherein said at least one element is present in the range of from about 1% to about 10% by weight.

6. The method according to claim 4 wherein said at least one element is yttrium present in an amount of about 1.5% by weight.

7. The method according to claim 3 wherein the metal coating is deposited to an effective thickness to produce said modified-aluminide diffusion coating with a thickness in a range of about 50 micrometers to about 150 micrometers after the step of heat treating.

8. The method according to claim 3 wherein said at least one reactive element is a combination of yttrium and silicon.

9. The method according to claim 3 wherein said at least one reactive element is a combination of yttrium and hafnium.

10. The method according to claim 3 wherein said at least one reactive element is a combination of silicon and hafnium.

11. The method according to claim 3 wherein the temperature of said substrate does not exceed about 100° C. during deposition of said single layer.

12. The method according to claim 1 wherein providing the source comprising the uniform mixture of aluminum and said at least one element comprises producing a wire with said uniform mixture of aluminum and said at least one element by forcing a liquid metal mixture comprising aluminum and said at least one element through a heated mold and solidifying on an exterior of said mold to produce the wire and drawing said wire.

13. A method of producing a modified-aluminide diffusion coating on a metal object formed of a metal selected from the group consisting of steels, nickel based alloys, and cobalt based alloys, comprising:

provided the metal object and fixing the metal object within a coating apparatus;

providing a source comprising a uniform mixture of aluminum and at least one element selected from the group consisting of yttrium, scandium, cerium, lanthanum, hafnium, silicon, zirconium, thorium and samarium, said at least one element being present in a range of from about 0.01% to about 20% by weight;

thermally evaporating material from said source and depositing a single layer metal coating of preselected thickness on said metal object by ion vapor deposition; and heat treating the coated metal object in an inert gas or reductive gas atmosphere within an effective temperature range and for an effective period of time to promote interdiffusion between the metal object and said metal coating to form said modified-aluminide diffusion coating.

14. The method according to claims wherein the temperature of said substrate does not exceed about 100° C. during deposition of said single layer. and wherein the effective temperature range during heat treating is between about 500° C. to about 1200° C., the effective period of time being between about 1 hour to about 24 hours.

15. The method according to claim 14 wherein said at least one element is present in the range of from about 1% to about 10% by weight.

16. The method according to claim 15 wherein said at least one element is yttrium present in an amount of about 1.5% by weight.

17. The method according to claim 14 wherein the metal coating is deposited to an effective thickness to produce said modified-aluminide diffusion coating with a thickness in the range of about 50 micrometers to about 150 micrometers after the step of heat treating.

18. The method according to claim 14 wherein said at least one reactive element is a combination of yttrium and silicon.

19. The method according to claim 14 wherein said at least one reactive element is a combination of yttrium and hafnium.

20. A method of producing a modified-aluminide diffusion coating on a metal object formed of a metal selected from the group consisting of steels, nickel based alloys, and cobalt based alloys, comprising:

providing the metal object and fixing the metal object within a coating apparatus;

providing a source consisting essentially of a uniform mixture of aluminum and yttrium, yttrium being present in a range of from about 0.01% to about 20% by weight, thermally evaporating material from said source and depositing a metal coating on said metal object by ion vapor deposition; and heat treating the coated metal object in an inert gas or reductive gas atmosphere at a temperature in a range from about 500° C. to about 1200° C. for a period of time between about 1 hour to about 24 hours to promote interdiffusion between the metal object and said metal coating to form said modified-aluminide diffusion coating.

21. The method according to claim 20 wherein said yttrium is present in an amount of about 0.5 to about 2% by weight.

* * * * *

UNITED STATES PATENT AND TRADEMARK OFFICE
CERTIFICATE OF CORRECTION

PATENT NO. : 5,807,613
DATED : September 15, 1998
INVENTOR(S) : Alina C. Aguero and Maria N. Korotkin It is certified that error appears in the above-identified patent and that said Letters Patent is hereby corrected as shown below:

In claim 14, column 13, line 24, delete "claims" and insert --claim 13--.

Signed and Sealed this

Twenty-seventh Day of July, 1999

Attest:

Q. TODD DICKINSON

*Attesting Officer*  *Acting Commissioner of Patents and Trademarks*